(12) United States Patent
Kim et al.

(10) Patent No.: US 11,293,943 B2
(45) Date of Patent: Apr. 5, 2022

(54) POWER INTERFACE

(71) Applicant: JUSUNG ENGINEERING CO., LTD., Gwangju-Si (KR)

(72) Inventors: Jung Bae Kim, Gwangju-Si (KR); Min Jong Keum, Gwangju-Si (KR); Young Tae Yoon, Ansan-Si (KR); Kyung Guk Lee, Seoul (KR)

(73) Assignee: JUSUNG ENGINEERING CO., LTD.

( * ) Notice: Subject to any disclaimer, the term of this patent is extended or adjusted under 35 U.S.C. 154(b) by 0 days.

(21) Appl. No.: 16/964,196

(22) PCT Filed: Feb. 7, 2019

(86) PCT No.: PCT/KR2019/001548
§ 371 (c)(1),
(2) Date: Jul. 22, 2020

(87) PCT Pub. No.: WO2019/156490
PCT Pub. Date: Aug. 15, 2019

(65) Prior Publication Data
US 2021/0033641 A1    Feb. 4, 2021

(30) Foreign Application Priority Data

Feb. 9, 2018 (KR) .................. 10-2018-0016201

(51) Int. Cl.
*G01R 1/04* (2006.01)

(52) U.S. Cl.
CPC .................. *G01R 1/0416* (2013.01)

(58) Field of Classification Search
CPC ............. G01R 1/0416; G01R 1/06716; G01R 1/06722
See application file for complete search history.

(56) References Cited

U.S. PATENT DOCUMENTS

2006/0006887 A1   1/2006  Kister
2006/0040417 A1*  2/2006  Eldridge .................. G01R 3/00
                                                        438/14

FOREIGN PATENT DOCUMENTS

KR   20050017759 A    2/2005
KR   20110074437 A    6/2011
(Continued)

OTHER PUBLICATIONS

Written Opinion for PCT/KR2019/001548 dated May 17, 2019.
International Search Report for PCT/KR2019/001548 dated May 17, 2019.

*Primary Examiner* — Clayton E. LaBalle
*Assistant Examiner* — Michael A Harrison
(74) *Attorney, Agent, or Firm* — Renaissance IP Law Group LLP (57) ABSTRACT

The present disclosure relates to a power interface, and more particularly, to a power interface for electrically connecting an object to be tested and a test driving unit. The electric power interface in accordance with an exemplary embodiment includes: a support member; an elastic member fixed to the support member and configured to provide an elastic force in a vertical direction; a first connection terminal disposed on the elastic member; a second connection terminal electrically connected to the first connection terminal; and a flexible sheet has one side fixed to the elastic member and the other side fixed to the support member to restrict a deformation range of the elastic member.

12 Claims, 3 Drawing Sheets

(56) References Cited

FOREIGN PATENT DOCUMENTS

| KR | 20160124347 A | 10/2016 |
| KR | 20170035372 A | 3/2017 |
| KR | 20170084727 A | 7/2017 |

* cited by examiner

POWER INTERFACE

TECHNICAL FIELD

The present disclosure relates to a power interface, and more particularly, to a power interface for electrically connecting an object to be tested and a test driving unit.

BACKGROUND

A light emitting element represents a device used as a light source for converting an electrical signal into infrared rays or light by using compound semiconductor characteristics to transmit or receive the signal.

The light emitting element has been applied to various kinds of applied products including a thin film transistor liquid crystal display (TFT-LCD), a plasma display panel (PDP), an organic light emitting diodes (OLED). The above-described light emitting element is manufactured by repeating processes such as photo, diffusion, deposition, etching, and ion implant.

In general, an aging process for performing a reliability test is performed during a manufacturing process of the light emitting element in order to check in advance whether the light emitting element is properly driven.

The aging process includes a basic particle inspection, and checks whether the light emitting element is normally operated by applying an electrical signal during a predetermined time in a state in which the light emitting element is transferred and held in an aging chamber.

In order to check whether the light emitting element is normally operated, a power interface for electrically connecting the light emitting element, which is an object to be tested, and a test driving unit. In a related art, a pogo pin having a shape in which a pin is mounted to a main body including a spring is generally used as a power interface.

However, as the pogo pin used for the inspection of the light emitting element of the related art moves by the spring in the main body, the main body and the pin surface-to-surface contact each other. Due to friction caused by the surface-to-surface contact, particles are continuously generated. Thus, an inspection time and an occurrence rate of contact failure of the manufactured light emitting element increase, and an additional process for removing the particles also requires a lot of time to reduce a yield.

RELATED ART DOCUMENT (Patent document 1) KR10-2005-0017759 A

Technical Problem

The present disclosure provides a power interface capable of electrically connecting an object to be tested and a test driving unit while elastically supporting the object to be tested.

Technical Solution

In accordance with an exemplary embodiment, a power interface includes: a support member; an elastic member fixed to the support member and configured to provide an elastic force in a vertical direction; a first connection terminal disposed on the elastic member; a second connection terminal electrically connected to the first connection terminal; and a flexible sheet has one side fixed to the elastic member and the other side fixed to the support member to restrict a deformation range of the elastic member. Here, the flexible sheet is not in contact with the elastic member and the support member in the rest area except for an area fixed to each of the elastic member and the support member.

The first connection terminal may be disposed on the elastic member to freely move according to deformation of the elastic member.

The elastic member may have a length and a width, which are determined to stand upright on the support member.

The flexible sheet may be deformed according to movement of the first connection terminal.

Each of the first connection terminal and the second connection terminal may have a pad shape having a predetermined contact area and is provided on the flexible sheet.

The support member may include a stepped portion so that a position at which the flexible sheet is fixed is disposed higher than that at which the elastic member is fixed.

The flexible sheet may be bent downward from an outer side of an upper end of the elastic member.

Each of the elastic member, the first connection terminal, and the second connection terminal may be provided in plurality, the plurality of first connection terminals may be disposed on the plurality of elastic members, respectively, and the plurality of second connection terminals may be electrically connected to the plurality of first connection terminals, respectively.

The flexible sheet may include a cut portion defined by removing at least a partial area between the plurality of first connection terminals.

The electric power interface may further include a flexible connection sheet configured to connect the plurality of first connection terminals to each other in order to restrict a movement range of each of the plurality of first connection terminals.

The flexible connection sheet may have a length greater than that between the plurality of first connection terminals.

The electric power interface may further include a printed circuit board fixed to the support member and configured to apply a test current to each of the plurality of second connection terminals.

Advantageous Effects

In accordance with a power interface of an exemplary embodiment, as the connection terminal electrically connected to the object to be tested is allowed to freely move by the elastic member and the flexible sheet, the electric power interface in accordance with the exemplary embodiment may prevent friction caused by the movement of the connection terminal and particles generated by the friction.

Also, as the object to be tested and the test driving unit are electrically connected by the conductive pattern provided on the flexible sheet, the electrical connection path may be minimized, and as the connection terminal is provided on the flexible sheet to increase the electrical contact area between the object to be tested and the test driving unit, the internal resistance according to the applying of the test current may be also effectively reduced.

DETAILED DESCRIPTION

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art.

Also, spatially relative terms, such as "above" or "upper" and "below" or "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Here, like reference numerals refer to like elements throughout.

Figure 1:
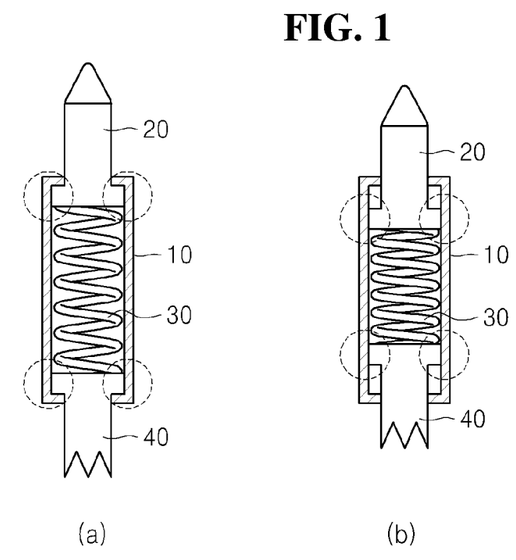
FIG. 1 is a view illustrating an appearance of a generally used pogo pin.

FIG. 1 is a view illustrating an appearance of a pogo pin that is generally used. Here, (a) of FIG. 1 is a view illustrating a state in which a spring 30 is stretched, and (b) of FIG. 1 is a view illustrating a state in which the spring 30 is compressed.

Referring to FIG. 1, the generally used pogo pin includes: a barrel 10 that is used as a main body and has a hollow therein; a contact tip 20 disposed at an upper end in the barrel 10; a spring 30 connected to the contact tip 20 in the barrel 10 to provide an elastic force for compression and stretching; and a plunger 40 connected to an opposite side of the spring 30 connected to the contact tip 20 to perform a piston movement.

The above-described pogo pin performs an electrical function test by electrically connecting an object to be tested, e.g., a connection terminal of a lighting element, and a test driving unit while absorbing a mechanical impact by the plunger 40 and the contact tip 20 through compression and stretching of the spring 30.

However, the above-described pogo pin surface-to-surface contacts an inside of the barrel 10 while the contact tip 20 and the plunger 40 vertically move by the compression and stretching of the spring 30. The contact tip 20, the plunger 40, and the barrel 10 are worn-out by the above-described surface-to-surface contact between the contact tip 20, the plunger 40, and the barrel 10, and, as the contact tip 20, the plunger 40, and the barrel 10 are worn-out, particles are continuously generated from the pogo pin.

Accordingly, as the occurrence rate of contact failure and short-circuit of the manufactured lighting element increases, a time required for an electrical function test of the lighting element in the aging process including the basic particle inspection increases, and a time for the additional process for removing particles also increases, the yield of manufacturing the lighting element is remarkably reduced.

Accordingly, when the object to be tested is elastically supported and electrically connected to the test driving unit, the electric power interface in accordance with an exemplary embodiment suggests a technical feature of preventing surface-to-surface friction caused by an elastic movement and minimizing generation of particles.

Figure 2:
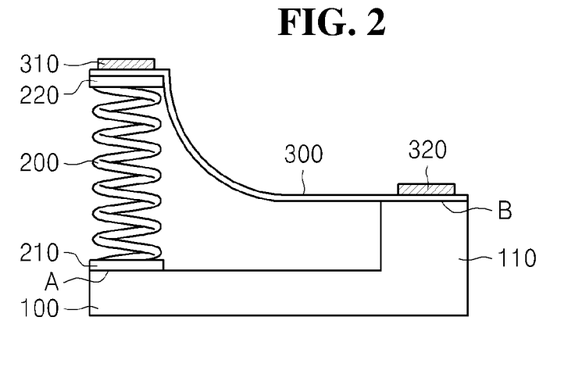
FIG. 2 is a view illustrating an appearance of a power interface in accordance with an exemplary embodiment.
Figure 3:
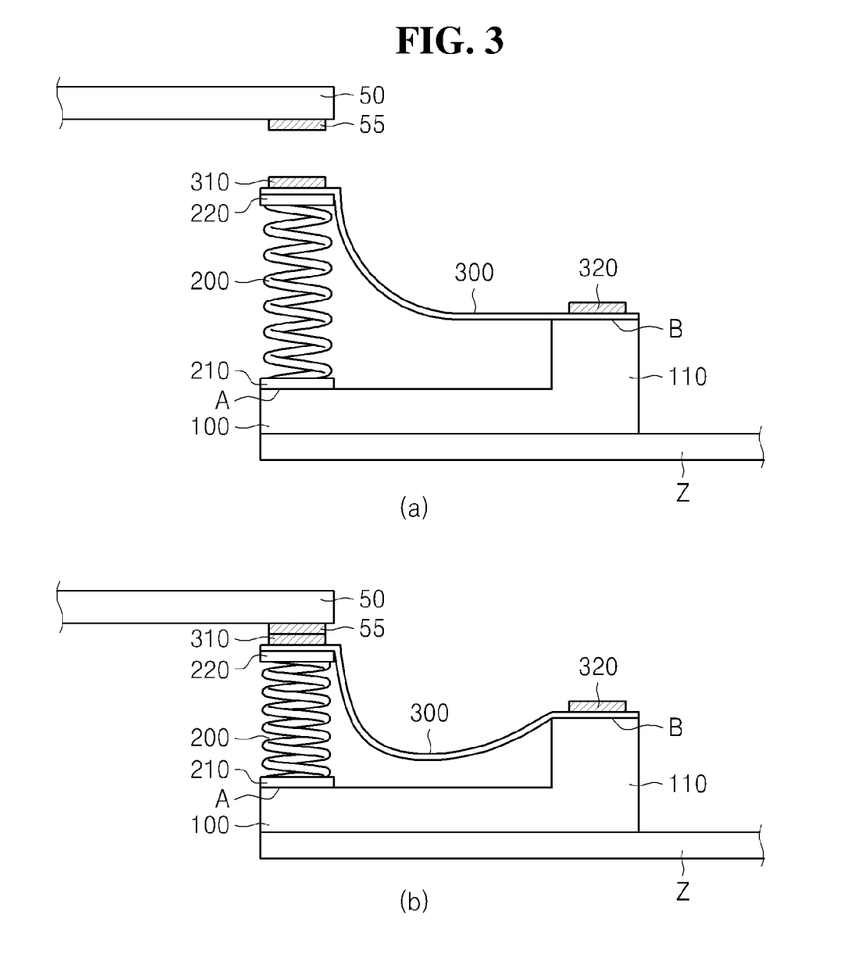
FIG. 3 is a view illustrating a state in which the electric power interface in accordance with an exemplary embodiment operates.

FIG. 2 is a view illustrating an appearance of the electric power interface in accordance with an exemplary embodiment, and FIG. 3 is a view illustrating a state in which the electric power interface in accordance with an exemplary embodiment operates. Here, (a) of FIG. 3 is a view illustrating a state in which an elastic member 200 is stretched, and (b) of FIG. 3 is a view illustrating a state in which the elastic member 200 is compressed.

Referring to FIGS. 2 and 3, the electric power interface in accordance with an exemplary embodiment includes: a support member 100; an elastic member 200 fixed to the support member 100 to provide an elastic force in a vertical direction; a first connection terminal 310 disposed on the elastic member 200; a second connection terminal 320 electrically connected to the first connection terminal 310; and a flexible sheet 300 having one side fixed to the elastic member 200 and the other side fixed to the support member 100 to restrict a deformation range of the elastic member 200.

The support member 100 is disposed at a lower portion to fix a partial area of each of the elastic member 200 and the flexible sheet 300. The support member 100 may have a plate shape extending in one direction, and the elastic member 200 is fixed to a top surface of the support member 100. Here, the support member 100, which is for fixing a partial area of each of the elastic member 200 and the flexible sheet 300, may be made of a non-conductive synthetic resin material such as plastic.

The elastic member 200 has a lower end fixed to the support member 100 and stand upward to provide an elastic force in a vertical direction. As described later, the first connection terminal 310 may be disposed on the elastic member 200 to freely move according to deformation of the elastic member 200. Thus, since the elastic member 200 supports the first connection terminal 310, and vertically moves the first connection terminal 310 by compression and stretching, a length and width of the elastic member 200 are determined so that the elastic member 200 stands on the support member 100. That is, since the elastic member 200 stands without being deviated to a side direction on the support member 100 as the length decreases and the width increases, the length and width of the elastic member 200 may be determined to have a maximally decreased length and a maximally increased width within a range of providing an elastic force to the first connection terminal 310.

The elastic member 200 may include various members that are not in surface-to-surface contact when providing an elastic force upward. Although a spring is exemplarily illustrated as the elastic member 200 in the drawings, an exemplary embodiment is not limited thereto. For example, the elastic member 200 may include various members that are curved or bent to provide an elastic force upward through compression or stretching.

Here, the elastic member 200 has a lower end fixed to the top surface of the support member 100 and an upper end fixed to a bottom surface of the flexible sheet 300. Here, a first fixing member 210 for easily coupling the elastic member 200 to the top surface of the support member 100 may be installed between the lower end of the elastic member 200 and the top surface of the support member 100. The first fixing member 210 may have a projection shape for insert-coupling the elastic member 200 or a shape providing a contact surface corresponding to the top surface of the support member 100. Also, a second fixing member 220 for supporting the flexible sheet 300 to be flat may be installed between the upper end of the elastic member 200 and the bottom surface of the flexible sheet 300. The above-described first and second fixing members 210 and 220 may be integrated with or attached to the support member 100 or the flexible sheet 300.

The first connection terminal 310 may be disposed on the elastic member 200, and the second connection terminal 320 may be electrically connected to the first connection terminal 310. Here, the first connection terminal 310 may be disposed at one side of the top surface of the flexible sheet 300, which extends onto the elastic member 200, to freely move according to the deformation of the elastic member 200. Here, the free movement according to the deformation of the elastic member 200 represents a structure that is not directly supported by a separate structure controlling a movement direction besides the deformation of the elastic member 200. As described above, when the first connection terminal 310 is disposed on the elastic member 200 to freely move according to the deformation of the elastic member 200, friction due to the movement of the first connection terminal 310 may not occur, and accordingly, particles may not be generated.

Also, the second connection terminal 320 is electrically connected to the first connection terminal 310. Here, the second connection terminal 320 may be disposed at the other side of the top surface of the flexible sheet 300, which is fixed to the support member 100, and electrically connected to the first connection terminal 310 through a conductive pattern provided on the top surface or the inside of the flexible sheet 300.

Here, the first connection terminal 310, the second connection terminal 320, and the flexible sheet 300 may be provided as a flexible printed circuit board (FPCB) including a circuit pattern that electrically connects the first connection terminal 310 and the second connection terminal 320. That is, the first connection terminal 310, the second connection terminal 320, and the flexible sheet 300 may be provided as a flexible printed circuit board having flexibility in which a conductive pattern made of a copper foil is provided on a flexible film.

As described above, as the first connection terminal 310 and the second connection terminal 320 electrically connected to the first connection terminal 310 are disposed on the flexible sheet 300 to electrically connect an object to be tested 50 and the test driving unit on the flexible sheet 300, the electric power interface in accordance with an exemplary embodiment may minimize internal resistance. That is, as described above, when the pogo pin is used as the electric power interface, a path electrically connecting the object to be tested 50 and the test driving unit is provided by the barrel 10 and the spring between the contact tip 20 and the plunger 40. On the other hand, since the object to be tested 50 and the test driving unit are electrically connected by the first connection terminal 310 and the second connection terminal 320, which are disposed on the flexible sheet 300, instead of electrically connecting the object to be tested 50 and the test driving unit through the barrel 10 and the spring, the electric power interface in accordance with an exemplary embodiment may minimize the electrical connection path and also effectively reduce the internal resistance.

Each of the first connection terminal 310 and the second connection terminal 320 may have a pad shape having a predetermined contact area in order to increase a contact property. That is, the first connection terminal 310 may have a pad shape for increasing a contact property with a connection terminal 55 of the object to be tested 50, and the second connection terminal 320 may have a pad shape in order to increase a contact property with a printed circuit board of the test driving unit for inspecting electrical characteristics of the object to be tested 50. Although not shown, as a plurality of projections are provided on a top surface of each of the first connection terminal 310 and the second connection terminal 320, a contact property between the object to be tested 50 and the test driving unit may further improve.

The flexible sheet 300 has one side fixed to the elastic member 200 and the other side fixed to the support member 100 to restrict the deformation range of the elastic member 200. That is, the flexible sheet 300 has one side fixed to the upper end of the elastic member 200 and the other side fixed to the support member 100. Here, the flexible sheet 300 is deformed according to movement of the first connection terminal 310 due to the compression and stretching of the elastic member 200 and movement of the first connection terminal due to deformation of the elastic member 200 in a side direction while simultaneously restricting the deformation range of the elastic member 200. The above-described flexible sheet 300 may have a film shape having a property that is flexibly bent when an external pressure is applied. The flexible sheet 300 may be made of various elastic synthetic resin materials such as polypropylene and polyethylene.

Here, as the flexible sheet 300 has one side fixed to the upper end of the elastic member 200 and the other side fixed to the support member 100, the flexible sheet 300 is not in contact with the elastic member 200 and the support member 100 in the rest area except for the area in which the flexible sheet 300 is fixed to each of the upper end of the elastic member 200 and the support member 100. The flexible sheet 300 may have one end fixed to the upper end of the elastic member 200 and the other end fixed to the support member 100, or, although not shown, have both ends fixed to the support member 100 and a partial area between the both ends, which is fixed to the upper end of the elastic member 200. Also, the flexible sheet 300 may be disposed in various manners within a range of restricting the deformation range of the elastic member 200. For example, the flexible sheet 300 may have one end fixed to the upper end of the elastic member 200 and the other end fixed to the support member 100 at the lower end of the elastic member 200.

Also, a partial area of the flexible sheet 300 may be fixed to the top surface of the support member 100. That is, when, in the support member 100, an area to which the elastic member 200 is fixed is referred to as a first area, and an area to which the flexible sheet 300 is fixed is referred to as a second area, each of the first area and the second area may be provided at the top surface of the support member 100. In this case, as the area fixed to the elastic member 200 and the area fixed to the support member 100 are disposed in a side direction, the flexible sheet 300 may not contact the elastic member 200 even when the elastic member 200 is compressed or stretched.

Here, the flexible sheet 300 serves to restrict the elastic member 200 from being deformed or deviated in the side direction within a range of allowing the compression or stretching of the elastic member 200. Accordingly, the support member 100 may include a stepped portion 110 that is provided to arrange the second area, to which the flexible sheet 300 is fixed, higher than the first area, to which the elastic member 200 is fixed. The stepped portion 110 may protrude from the top surface of the support member 100. When the stepped portion 110 is provided so that the second area is disposed higher than the first area in the support member 100 as described above, a length of the flexible sheet 300 extending between the elastic member 200 and the support member 100 may decrease in comparison with when the second area is disposed on the same plane as the first area, and accordingly the elastic member 200 may be further easily restricted from being deformed or deviated in the side direction.

That is, in case of FIG. 2, the flexible sheet 300 provides a tensile force when the elastic member 200 is inclined in a left direction to prevent the elastic member 200 from being deformed or deviated. Although not shown, in case that the both ends of the flexible sheet 300 are fixed to the support member 100, and a partial area between the both ends is fixed to the upper end of the elastic member 200, the flexible sheet 300 may provide a tensile force when the elastic member 200 is inclined in a left or right direction to prevent the elastic member 200 from being deformed or deviated. Also, since the flexible sheet 300 has a predetermined width, the flexible sheet 300 may provide a tensile force even when the elastic member 200 is inclined in a front or rear direction. In this case, although the flexible sheet 300 may not completely prevent the elastic member 200 from being deformed in the side direction, in terms of a more serious limitation due to particle generation, the flexible sheet 300 may contribute to a simple configuration and reduction in manufacturing costs by restricting the deformation range of the elastic member 200 in a predetermined range when applied to a lighting element having a relatively great width and pitch of the connection terminal 55 of the object to be tested 50.

Also, the flexible sheet 300 may be bent downward from an outer side of the upper end of the elastic member 200. That is, since the first connection terminal 310 is disposed on the upper end of the elastic member 200 and exposed upward, as only the first connection terminal 310 is exposed upward, and the conductive pattern electrically connecting the first connection terminal 310 and the second connection terminal 320 is minimally exposed upward, the flexible sheet 300 may be bent downward from the outer side of the upper end of the elastic member 200, i.e., an outer side of the first connection terminal 310, so that the connection terminal 55 of the object to be tested 50 is connected to the first connection terminal 310.

As described above, the electric power interface in accordance with an exemplary embodiment may have a structure from which the surface-to-surface contact is removed in vertical movement of the first connection terminal 310 provided on the flexible sheet 300 according to the compression or stretching of the elastic member 200.

That is, the first connection terminal 310 vertically moves by the elastic force of the elastic member 200 disposed below the flexible sheet 300 as a jig Z seated on the support member 100 presses the object to be tested 50 while being restricted in movement range by the flexible sheet 300. Accordingly, when the first connection terminal 310 moves by the elastic force of the elastic member 200, particles generated due to friction may be prevented.

Also, the above-described electric power interface in accordance with an exemplary embodiment may be provided in plurality, and the plurality of electric power interfaces may be disposed adjacent to each other. That is, the plurality of electric power interfaces may be spaced a predetermined distance from each other in order to be electrically connected to a plurality of connection terminals 55 of the object to be tested 50, respectively. In this case, each of the electric power interfaces may be inserted into a separate structure in which a groove through which the support member 100 is fixedly inserted is defined. Also, the electric power interfaces having a partially integrated structure may be electrically connected to the plurality of connection terminals 55 of the object to be tested 50, respectively, and the above-described electric power interface in accordance with another exemplary embodiment will be described later in detail.

Figure 4:
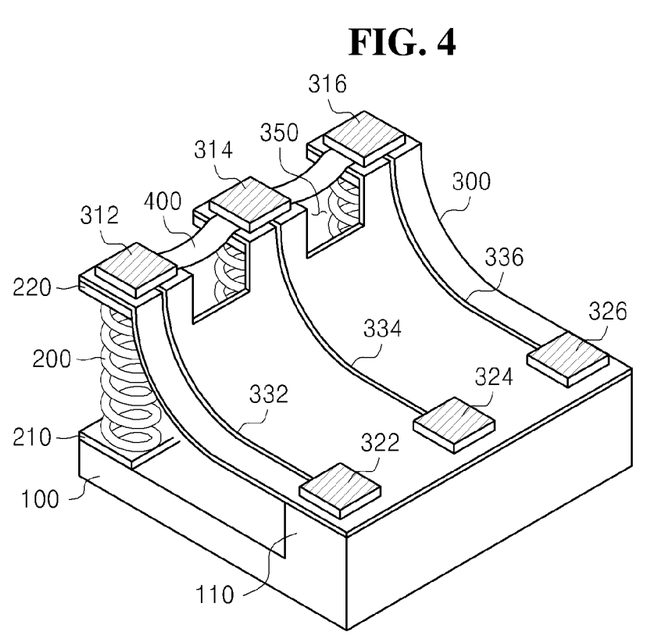
FIG. 4 is a schematic perspective view illustrating an appearance of a power interface in accordance with another exemplary embodiment.

FIG. 4 is a schematic perspective view illustrating an appearance of the electric power interface in accordance with another exemplary embodiment.

Referring to FIG. 4, the electric power interface in accordance with another exemplary embodiment is different from the above-described electric power interface in accordance with an exemplary embodiment in that each of the elastic member 200, the first connection terminal 310, and the second connection terminal 320 is provided in plurality, the plurality of first connection terminals 312, 314, and 316 are disposed on the plurality of elastic members 200, respectively, and the plurality of second connection terminals 322, 324, and 326 are electrically connected to the plurality of first connection terminals 312, 314, and 316.

That is, the electric power interface in accordance with another exemplary embodiment is different from the above-described electric power interface in accordance with an exemplary embodiment in terms of including the integrated support member 100 and flexible sheet 300. Since the above-described features of the electric power interface in accordance with an exemplary embodiment may be directly applied except for features of the integrated support member 100 and flexible sheet 300, overlapped descriptions will be omitted.

The support member 100 is disposed at a lower portion to fix a partial area of each of the flexible sheets 300, which fixes an upper end of each of the plurality of elastic members 200 and the plurality of elastic members 200. The support member 100 may have a plate shape extending in each of one direction for fixing the partial area of the flexible sheet 300 and the other direction in which the plurality of elastic members 200 are arranged. Here, when an area to which the plurality of elastic members 200 are fixed is referred to as a first area, and an area to which the flexible sheet 300 is fixed is referred to as a second area, the first area may extend in a direction in which the plurality of elastic members 200 are arranged, and the second area may extend in a direction in which the plurality of second connection terminals 320 are arranged. Also, as described above, the support member 100 may be made of a non-conductive synthetic resin material such as plastic.

Here, as each of the plurality of elastic members 200 is fixed to the first area, and the flexible sheet 300 is fixed to the second area, each of the first area and the second area may be provided on a top surface of the support member 100. Also, the support member 100 may include a stepped portion 110 that is provided so that the second area is disposed higher than the first area. As described above, as each of the first area and the second area is provided on the top surface of the support member 100, the area fixing the plurality of elastic members 200 and the area fixing the flexible sheet 300 may be arranged in a side direction. Accordingly, the flexible sheet 300 may not contact the elastic members 200 even when each of the elastic members 200 is compressed or stretched, the flexible sheet 300 may decrease in length by arranging the second area higher than the first area, and each of the elastic members 200 may be further easily restricted from being deviated to the side direction.

Each of the elastic members 200 has a lower end fixed to the support member 100 and provides an elastic force upward. Although a spring, which does not have a surfaceto-surface structure when compressed or stretched, is preferably used as the elastic member 200, the elastic member 200 may include various members that are curved or bent to provide an elastic force upward through compression or stretching. Also, although as the plurality of elastic members 200 are arranged in one direction, a lower end of each of the elastic members 200 is fixed to the support member 100 in FIG. 4, each of the elastic members 200 may be arranged and fixed in a different manner according to arrangement of the connection terminals of the objects to be tested.

The flexible sheet 300 extends to be fixed to each of the upper end of each of the plurality of elastic members 200 and the support member 100, and the plurality of first connection terminals 312, 314, and 316 disposed on the upper end of each of the elastic members 200 and exposed upward and the plurality of second connection terminals 322, 324, and 326 electrically connected to the plurality of first connection terminals 312, 314, and 316, respectively are disposed on a top surface of the flexible sheet 300.

That is, the flexible sheet 300 has an area fixing the upper end of each of the elastic members 200 in an integrated manner and another area fixed to the support member 100, and is spaced apart from the elastic member 200 and the support member 100 in the rest area except for the areas fixing the upper end of each of the elastic members 200 and the support member 100. Here, the flexible sheet 300 serves to restrict the elastic member 200 from being deviated to the side direction within a range of allowing the compression or stretching of the elastic member 200. Also, the flexible sheet 300 has a film shape that is flexibly bent when an external pressure is applied, and the plurality of first connection terminals 312, 314, and 316 and the second connection terminals 322, 324, and 326, which are exposed on the flexible sheet 300, are electrically connected by conductive patterns 332, 334, and 336, respectively. Here, as illustrated, the plurality of first connection terminals 312, 314, and 316 may be electrically connected to the plurality of second connection terminals 322, 324, and 326 in a one-to-one correspondence manner. Alternatively, the conductive pattern may be provided to electrically connect a portion of the plurality of first connection terminals 312, 314, and 316 to one second connection terminal. Also, as described above, a flexible printed circuit board may be used to easily provide the plurality of first connection terminals 312, 314, and 316, the plurality of second connection terminals 322, 324, and 326, and the conductive patterns 332, 334, and 336 on the flexible sheet 300.

Here, when the first connection terminal is disposed on the upper end of each of the elastic members 200, since the flexible sheet 300 is fixed to the upper end of each of the elastic members 200 in an integrated manner, each of the first connection terminals is restricted by another first connection terminal when individually vertically moves according to the compression and stretching of the elastic member 200 disposed therebelow. Thus, the flexible sheet 300 may include a plurality of cut portions 350 that are defined by removing at least a partial area between the plurality of first connection terminals 312, 314, and 316. Here, each of the cut portions 350 may be formed by partially removing a portion of the flexible sheet 300 between the first connection terminals adjacent thereto, and, resultantly, individually vertically move according to the compression and stretching of each of the elastic members 200 disposed below the first connection members 312, 314, and 316, respectively.

Also, the plurality of cut portions 350 may extend downward from the upper end of each of the elastic members 200. That is, the plurality of cut portions 350 may be formed by removing an area of the flexible sheet 300, which extends downward from at least a partial area between the plurality of first connection terminals 312, 314, and 316. Here, the flexible sheet 300 may be bent downward from the upper end of each of the plurality of elastic members 200, i.e., an outer side of the plurality of first connection terminals 312, 314, and 316. In this case, even when the plurality of first connection terminals 312, 314, and 316 are not arranged in one direction, as the plurality of cut portions 350 extend downward from the upper portion of each of the elastic member 200, the flexible sheet 300 may be bent downward from the upper portion of each of the elastic member 200.

Also, the electric power interface in accordance with the exemplary embodiment may further include a flexible connection sheet 400 connecting the plurality of first connection terminals 310 to each other. That is, when at least a partial area between the plurality of first connection terminals 312, 314, and 316 of the flexible sheet 300 is removed by the plurality of cut portions 350, the flexible connection sheet 400 connects the plurality of first connection terminals 312, 314, and 316 to each other within the removed partial area. Here, the flexible connection sheet 400 is provided to restrict a movement range of the first connection terminal, i.e., to prevent each of the first connection terminals from moving in the side direction as each of the elastic members 200 is inclined in the side direction. In this case, the flexible connection sheet 400 may have a length greater than that between the plurality of first connection terminals 312, 314, and 316. In this case, the flexible connection sheet 400 may be curved downward between the plurality of first connection terminals 312, 314, and 316. That is, when the flexible connection sheet 400 has the same length as that between the plurality of first connection terminals 312, 314, and 316, the flexible connection sheet 400 may have the same length as that when the cut portion 350 is not provided between the plurality of first connection terminals 312, 314, and 316. In this case, the first connection terminal is restricted when individually moves. However, as the flexible connection sheet 400 has a length greater than that between the plurality of first connection terminals 312, 314, and 316, each of the first connection terminals may individually move without interference with another first connection terminal, and be restricted from moving in the side direction within a predetermined range by adjusting the length of the flexible connection sheet 400. As described above, as a partial area of the flexible sheet 300 is fixed while being spaced apart in the side direction of the elastic member 200, and partial areas of the cut portions 350 defined between the plurality of first connection terminals 312, 314, and 316 are connected by the flexible connection sheet 400, the electric power interface in accordance with the exemplary embodiment may restrict each of the first connection terminals from moving in the front and rear direction in addition to both side directions to prevent each of the first connection terminals from being distorted or deviated.

Also, the electric power interface in accordance with another exemplary embodiment may further include a printed circuit board (not shown) including a circuit pattern for applying a test current to each of the plurality of second connection terminals 322, 324, and 326 disposed on the flexible sheet 300. Here, the printed circuit board may be provided to apply a test current from the test driving unit to the plurality of second connection terminals 322, 324, and 326, and the printed circuit board may be fixed to the support member 100 so that the circuit pattern of the printer circuit board is electrically connected to the plurality of second connection terminals 322, 324, and 326 disposed on the flexible sheet 300 on the support member 100. The printed circuit board may be coupled to and fixed on the support member 100 by a bolt or the like, and as the printed circuit board is directly coupled and fixed to the support member 100, the printed circuit board may be firmly coupled while maintaining the electrical connection with the second connection terminals 322, 324, and 326.

As described above, as the connection terminal electrically connected to the object to be tested is allowed to freely move by the elastic member 200 and the flexible sheet 300, the electric power interface in accordance with the exemplary embodiment may prevent friction caused by the movement of the connection terminal and particles generated by the friction.

Also, as the object to be tested and the test driving unit are electrically connected by the conductive pattern provided on the flexible sheet 300, the electrical connection path may be minimized, and as the connection terminal is provided on the flexible sheet 300 to increase the electrical contact area between the object to be tested and the test driving unit, the internal resistance according to the applying of the test current may be also effectively reduced.

Although the electric power interface has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. An electric power interface comprising:
a support member;
an elastic member fixed to the support member and configured to provide an elastic force in a vertical direction;
a first connection terminal disposed on the elastic member;
a second connection terminal electrically connected to the first connection terminal; and
a flexible sheet having a first area fixed to the elastic member and a second area fixed to the support member to restrict a deformation range of the elastic member,
wherein the flexible sheet is not in contact with the elastic member or the support member between the first area and the second area.

2. The electric power interface of claim 1, wherein the first connection terminal is disposed on the elastic member to freely move according to deformation of the elastic member.

3. The electric power interface of claim 1, wherein the elastic member has a length and a width, which are determined to stand upright on the support member.

4. The electric power interface of claim 1, wherein the flexible sheet is deformed according to movement of the first connection terminal.

5. The electric power interface of claim 1, wherein each of the first connection terminal and the second connection terminal has a pad shape having a predetermined contact area and is provided on the flexible sheet.

6. The electric power interface of claim 1, wherein the support member comprises a stepped portion so that a position at which the flexible sheet is fixed is disposed higher than that at which the elastic member is fixed.

7. The electric power interface of claim 1, wherein the flexible sheet is bent downward from an outer side of an upper end of the elastic member.

8. The electric power interface of claim 1, wherein each of the elastic member, the first connection terminal, and the second connection terminal is provided in plurality,
the plurality of first connection terminals are disposed on the plurality of elastic members, respectively, and
the plurality of second connection terminals are electrically connected to the plurality of first connection terminals, respectively.

9. The electric power interface of claim 8, wherein the flexible sheet comprises a cut portion defined by removing at least a partial area between the plurality of first connection terminals.

10. The electric power interface of claim 9, further comprising a flexible connection sheet configured to connect the plurality of first connection terminals to each other in order to restrict a movement range of each of the plurality of first connection terminals.

11. The electric power interface of claim 10, wherein the flexible connection sheet has a length greater than that between the plurality of first connection terminals.

12. The electric power interface of claim 8, further comprising a printed circuit board fixed to the support member and configured to apply a test current to each of the plurality of second connection terminals.

* * * * *